(12) United States Patent
Sekino

(10) Patent No.: US 8,594,159 B2
(45) Date of Patent: Nov. 26, 2013

(54) TRANSCEIVER AMPLIFIER AND DELAY DEVIATION COMPENSATION METHOD

(75) Inventor: Hiroyuki Sekino, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 241 days.

(21) Appl. No.: 12/724,216

(22) Filed: Mar. 15, 2010

(65) Prior Publication Data

US 2010/0172398 A1  Jul. 8, 2010

Related U.S. Application Data

(63) Continuation of application No. PCT/JP2007/068654, filed on Sep. 26, 2007.

(51) Int. Cl.
*H04B 1/38* (2006.01)
*H04L 5/16* (2006.01)

(52) U.S. Cl.
USPC .......................... 375/219; 375/220; 375/221

(58) Field of Classification Search
USPC .......................... 375/221, 219, 220
See application file for complete search history.

(56) References Cited

U.S. PATENT DOCUMENTS

| | | | | |
|---|---|---|---|---|
| 6,236,263 | B1 * | 5/2001 | Iwamatsu | 329/306 |
| 6,275,685 | B1 | 8/2001 | Wessel et al. | |
| 6,292,122 | B1 | 9/2001 | Younis et al. | |
| 2001/0051504 | A1 | 12/2001 | Kubo et al. | |
| 2002/0016154 | A1 * | 2/2002 | Huttunen | 455/63 |
| 2002/0131523 | A1 | 9/2002 | Nagasaka et al. | |
| 2005/0069026 | A1 * | 3/2005 | Vepsalainen et al. | 375/219 |

FOREIGN PATENT DOCUMENTS

| | | |
|---|---|---|
| EP | 1011192 | 6/2000 |
| JP | 07202955 | 8/1995 |
| JP | 09181781 | 7/1997 |
| JP | 09205464 | 8/1997 |
| JP | 09326724 | 12/1997 |
| JP | 11017762 | 1/1999 |
| JP | 11284675 | 10/1999 |
| JP | 2000216640 | 8/2000 |
| JP | 2001345718 | 12/2001 |
| JP | 2002533022 | 10/2002 |
| JP | 2007053552 | 3/2007 |
| WO | 0217586 A1 | 2/2002 |
| WO | 0237666 A2 | 5/2002 |

OTHER PUBLICATIONS

D. Preis: "Linear Distortion", AES, 60 East 42nd Street, Room 2520 New York 10165-2520, USA, Dec. 16, 1975, XP040346125, *the whole document*.
Extended Supplementary European Search Report dated May 11, 2011 for application No. 07807870.6-2215/2194684.
International Search Report dated Nov. 6, 2007 in corresponding International Application No. PCT/JP2007/068654.
Japanese Office Action dated Aug. 7, 2012 issued in application No. 2009-534086.

* cited by examiner

*Primary Examiner* — Qutbuddin Ghulamali
(74) *Attorney, Agent, or Firm* — Smith, Gambrell & Russell, LLP

(57) ABSTRACT

A feedback section acquires an analog signal that has passed through a band-pass filter, and converts the analog signal to a digital signal. A digital signal processing section compares the digital signal obtained from the feedback section and an input digital signal with each other to measure modulation accuracy, and performs delay correction on a subsequently input digital signal so as to improve the modulation accuracy.

6 Claims, 14 Drawing Sheets

139

Figure 1:
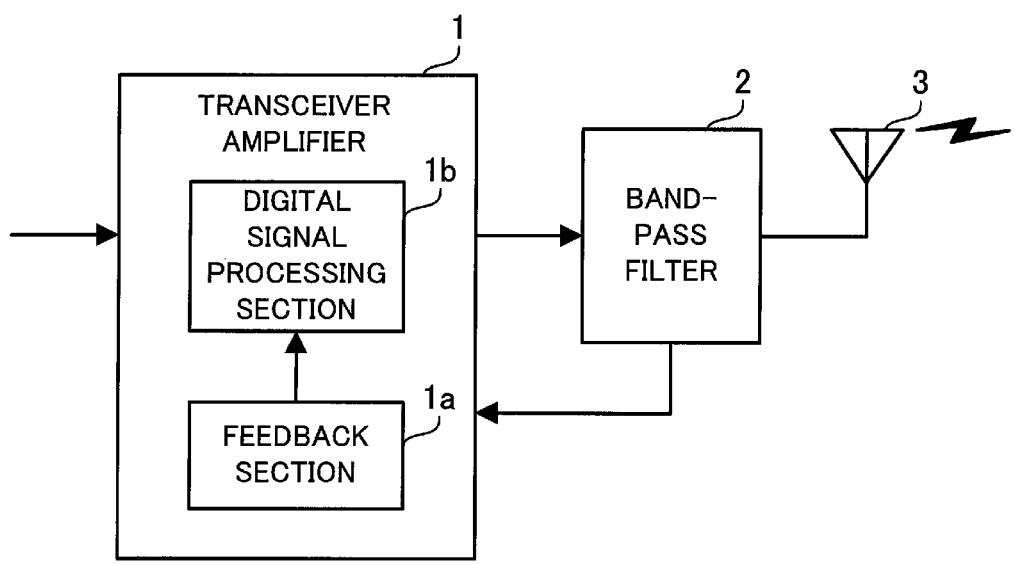

| COEFFICIENT TABLE | | | | | |
|---|---|---|---|---|---|
| | #1 | ... | #n-1 | #n | #n+1 | ... |
| $I_0$ | 0 | ... | 8 | 25 | 51 | ... |
| $I_1$ | 0 | ... | 11 | -3 | -31 | ... |
| $I_2$ | 0 | ... | -173 | -227 | -260 | ... |
| $I_3$ | 32768 | ... | 32714 | 32648 | 32555 | ... |
| $I_4$ | 0 | ... | 259 | 420 | 602 | ... |
| $I_5$ | 0 | ... | -64 | -115 | -179 | ... |
| $I_6$ | 0 | ... | 28 | 54 | 90 | ... |
| $I_7$ | 0 | ... | -16 | -35 | -62 | ... |
| $Q_0$ | 0 | ... | -160 | -239 | -318 | ... |
| $Q_1$ | 0 | ... | 271 | 409 | 547 | ... |
| $Q_2$ | 0 | ... | -843 | -1268 | -1693 | ... |
| $Q_3$ | 0 | ... | 1329 | 1990 | 2647 | ... |
| $Q_4$ | 0 | ... | -828 | -1233 | -1630 | ... |
| $Q_5$ | 0 | ... | 259 | 381 | 498 | ... |
| $Q_6$ | 0 | ... | -156 | -230 | -302 | ... |
| $Q_7$ | 0 | ... | 135 | 201 | 265 | ... |

FIG. 4

| BEFORE CORRECTION | | | AFTER CORRECTION | |
|---|---|---|---|---|
| I | Q | | I | Q |
| ... | ... | | ... | ... |
| -3350 | -3456 | | 4182 | -6721 |
| 4224 | -3314 | | -2263 | -5552 |
| -4914 | -8162 | | -1311 | -4508 |
| 2834 | -370 | | -3385 | -3983 |
| -5170 | -2356 | | 4003 | -2606 |
| 3460 | -4334 | | -4455 | -8865 |
| 1434 | 3266 | | 2525 | 211 |
| 3778 | -1550 | | -5106 | -2968 |
| -390 | -5620 | | 3595 | -3891 |
| -2366 | -2700 | | 1177 | 2937 |
| 5738 | -566 | | 3831 | -1239 |
| 4582 | 3918 | | -154 | -5689 |
| -920 | -894 | | -2475 | -2976 |
| -2352 | -2906 | | 5768 | -371 |
| -5094 | -1434 | | 4379 | 4008 |
| 894 | -5662 | | -776 | -974 |
| -9168 | -8974 | | -2271 | -2750 |
| 4244 | -6390 | | -5238 | -1829 |
| ... | ... | | ... | ... |

TRANSCEIVER AMPLIFIER AND DELAY DEVIATION COMPENSATION METHOD

This application is a continuing application, filed under 35 U.S.C. §111(a), of International Application PCT/JP2007/068654, filed Sep. 26, 2007.

FIELD

The embodiments discussed herein are related to transceiver amplifiers and methods for compensating delay deviation.

BACKGROUND

As a result of the advance of radio communication technologies, radio communication systems such as mobile phone systems are currently in wide use. When a communication device in a radio communication system transmits a radio signal, a digital signal to be transmitted is converted to an analog signal, then modulated and amplified by a transceiver amplifier. The analog signal generated in this manner is subjected to band limiting in a band pass filter (BPF) and then output from a transceiver antenna. Radio resources are limited, and thus, there has been a demand for further improvement in signal transmission efficiency to cope with the growth of radio communication systems.

One cause of the reduction in the transmission efficiency is amplification distortion caused in the amplifier. The amplifier is expected to have a linear relationship between the input and output signal levels. However, because of its physical properties, the amplifier exhibits nonlinearity in a range of the input signal level exceeding a predetermined level. Such nonlinearity of the amplifier brings about amplification distortion of the signal, causing reduction in the transmission efficiency. To cope with this, distortion compensation techniques have been proposed wherein, in a transceiver amplifier, a digital signal is previously applied with a distortion opposite to the amplification distortion caused in the amplifier, to suppress the amplification distortion of the analog signal having passed through the amplifier. In many distortion compensation techniques, a feedback circuit is used to convert the analog signal that has passed through the amplifier to a digital signal to detect distortion (see, e.g., Japanese Laid-open Patent Publications Nos. 2007-53552 and 11-284675).

Another cause of the reduction in the transmission efficiency is delay deviation caused in the band-pass filter. In the band-pass filter, delay attributable to the filtering process varies depending on the frequency. Namely, there arises a time difference in output timing between high- and low-frequency components of the input signal. Such delay deviation caused by the band-pass filter results in an increase in the signal decoding error at a receiving-side device, causing lowering of the transmission efficiency. To cope with this, delay deviation compensation techniques have been proposed wherein, in a transceiver amplifier, a digital signal is previously given a delay for canceling out the delay deviation caused by the band-pass filter, to suppress the delay deviation between the frequency components of the analog signal having passed through the band-pass filter (see, e.g., Japanese Laid-open Patent Publication No. 07-202955).

In recent years, removal of unwanted signals outside the transmission frequency band has been strictly demanded, with the result that the role of the band-pass filter has become more and more important. For example, in some applications, the desired signal power-to-interference signal power ratio at a frequency spaced by 5 MHz (megahertz) from the transmission frequency band is desired to be 110 dB (decibels) or higher.

Generally, a band-pass filter capable of more effective attenuation of unwanted signals outside the transmission frequency band tends to have a greater delay deviation between the frequency components. For this reason, there has been a demand for a delay deviation compensation technique capable of appropriately suppressing the occurrence of decoding error at the receiving-side device. With the technique disclosed in Japanese Laid-open Patent Publication No. 07-202955, however, it is difficult to set an optimum correction amount, in terms of transmission efficiency, for the delay deviation compensation. Consequently, the occurrence of decoding error at the receiving-side device fails to be satisfactorily suppressed.

SUMMARY

According to an aspect of the invention, a transceiver amplifier for converting an input digital signal to an analog signal, amplifying the analog signal, and outputting the amplified analog signal to a band-pass filter includes: a feedback section configured to acquire an analog signal that has passed through the band-pass filter, and convert the acquired analog signal to a digital signal; and a digital signal processing section configured to compare the digital signal obtained from the feedback section and the input digital signal with each other to measure modulation accuracy, and perform delay correction on a subsequently input digital signal in accordance with the measured modulation accuracy.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWING(S)

Figure 2:
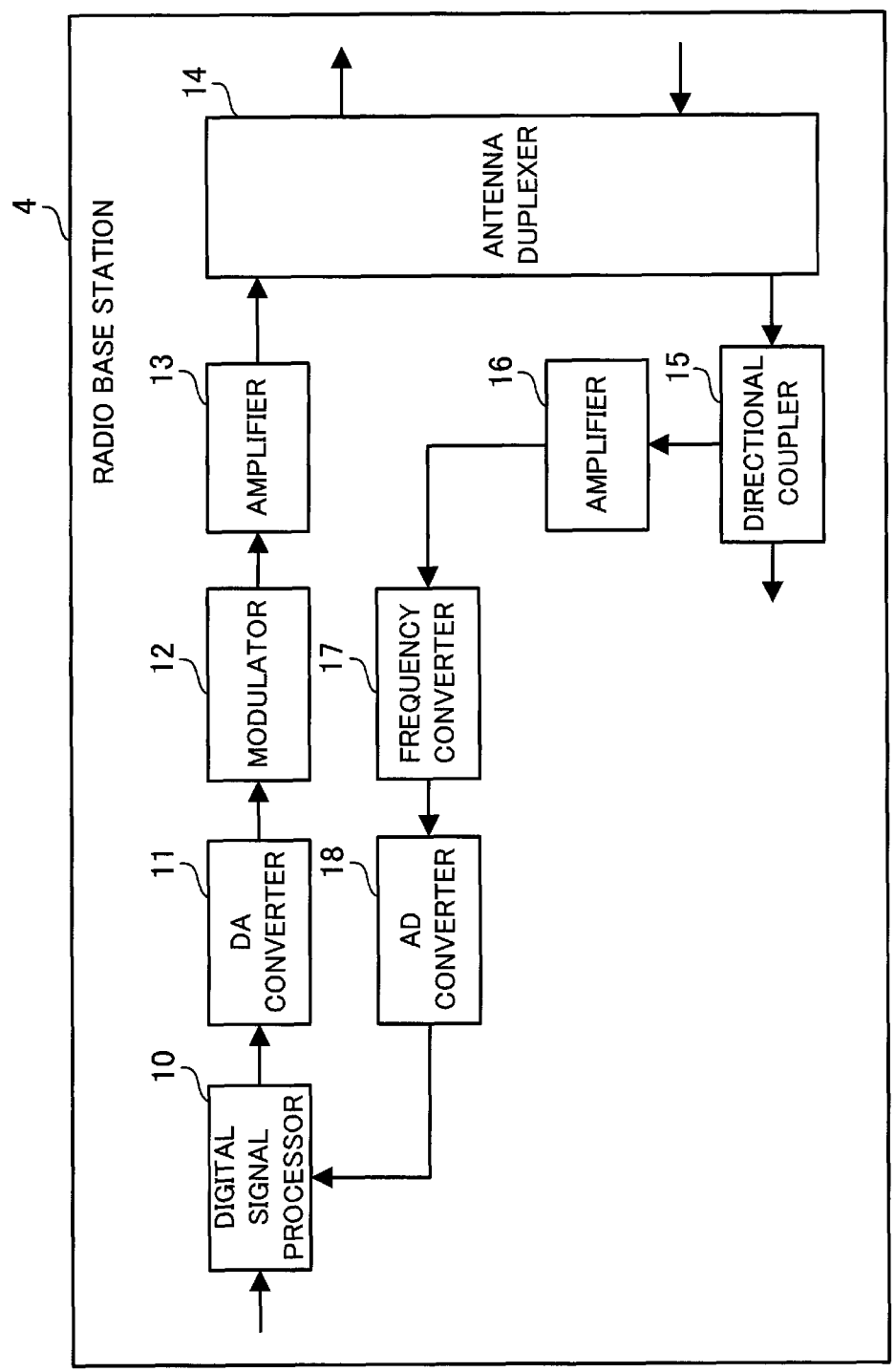
Figure 3:
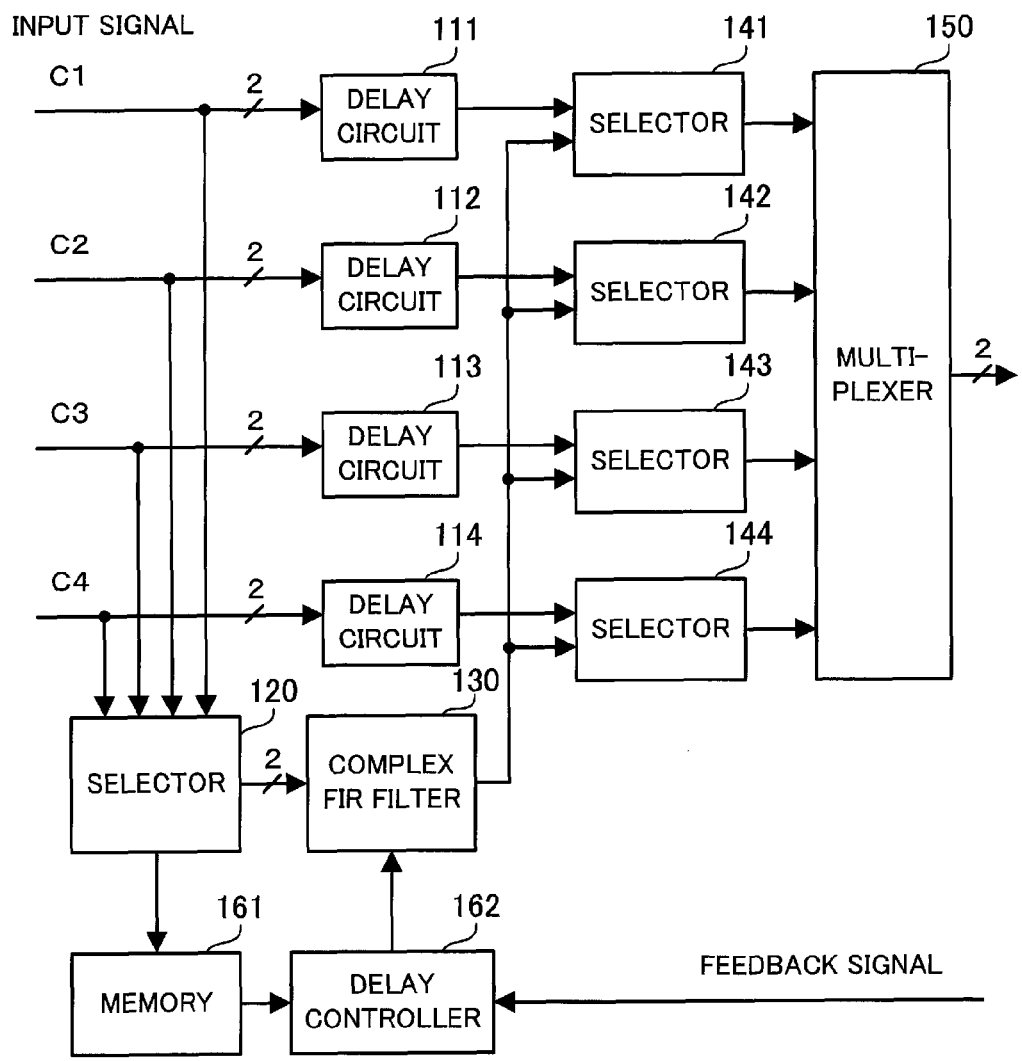
Figure 5:
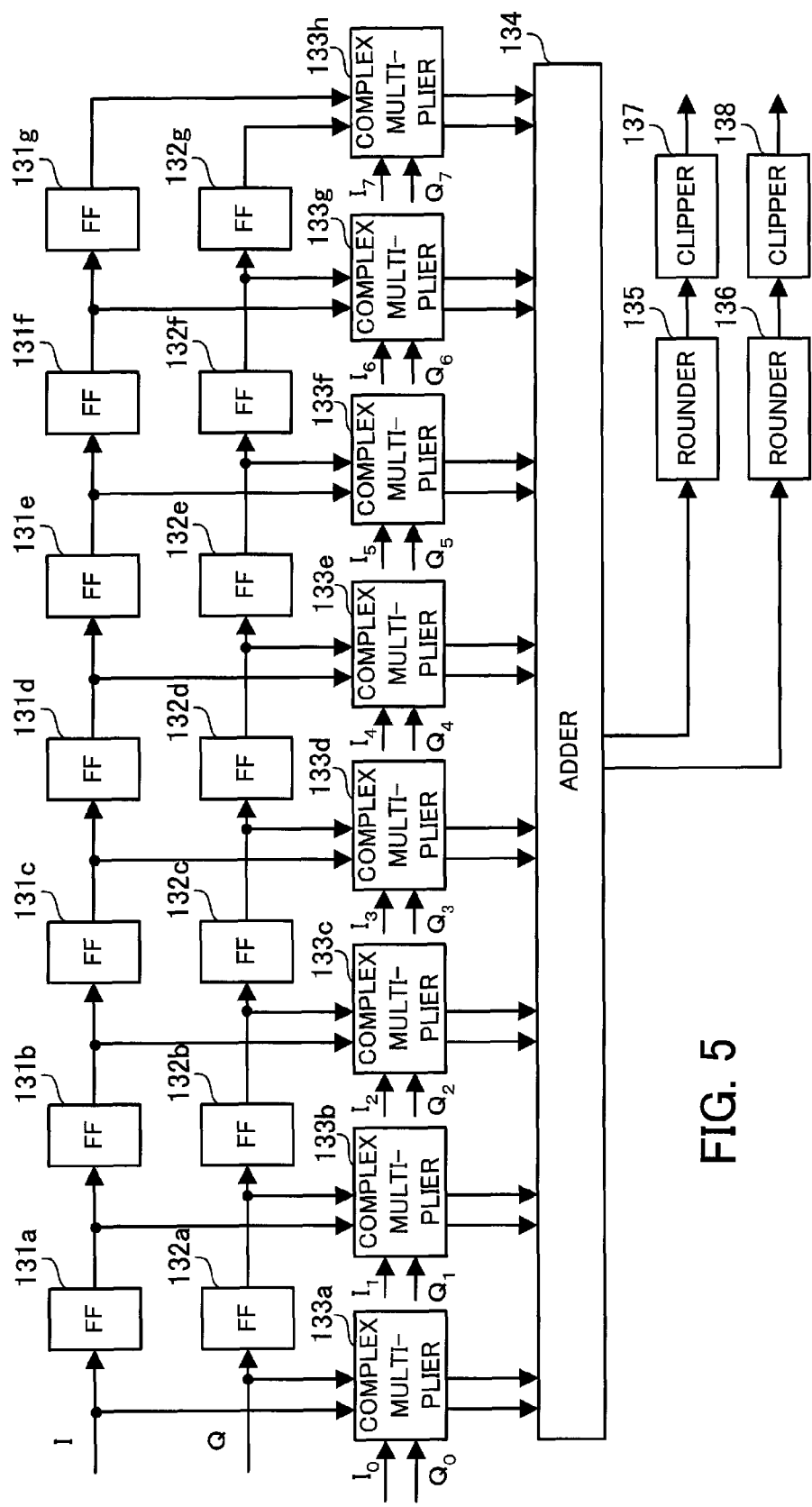
Figure 6:
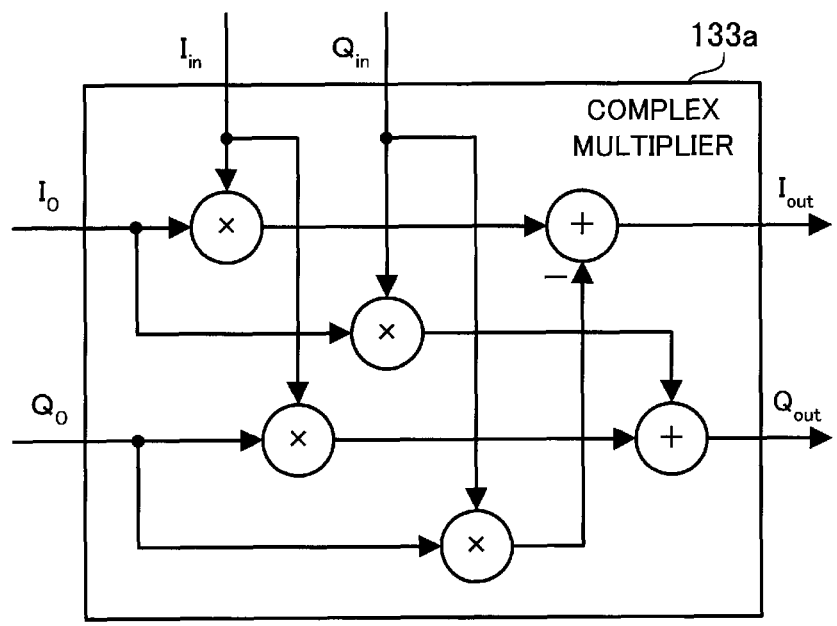
Figure 7:
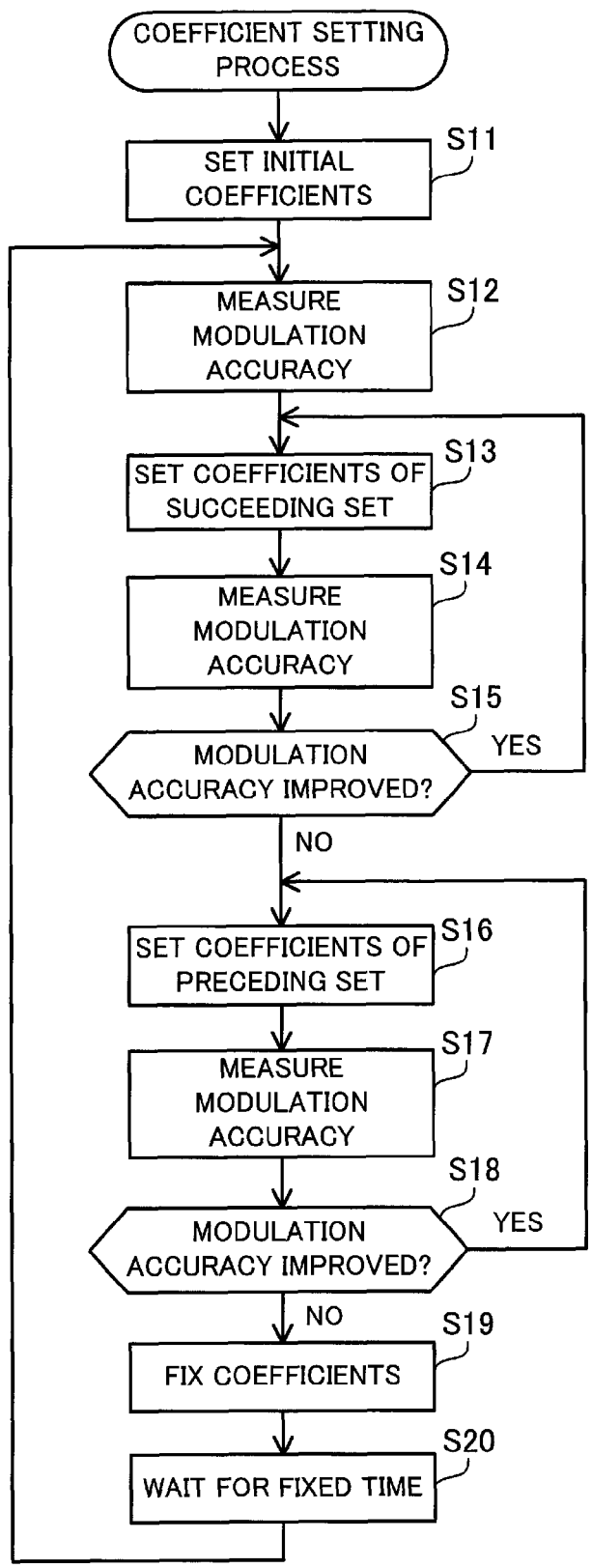
Figure 8:
Figure 9:
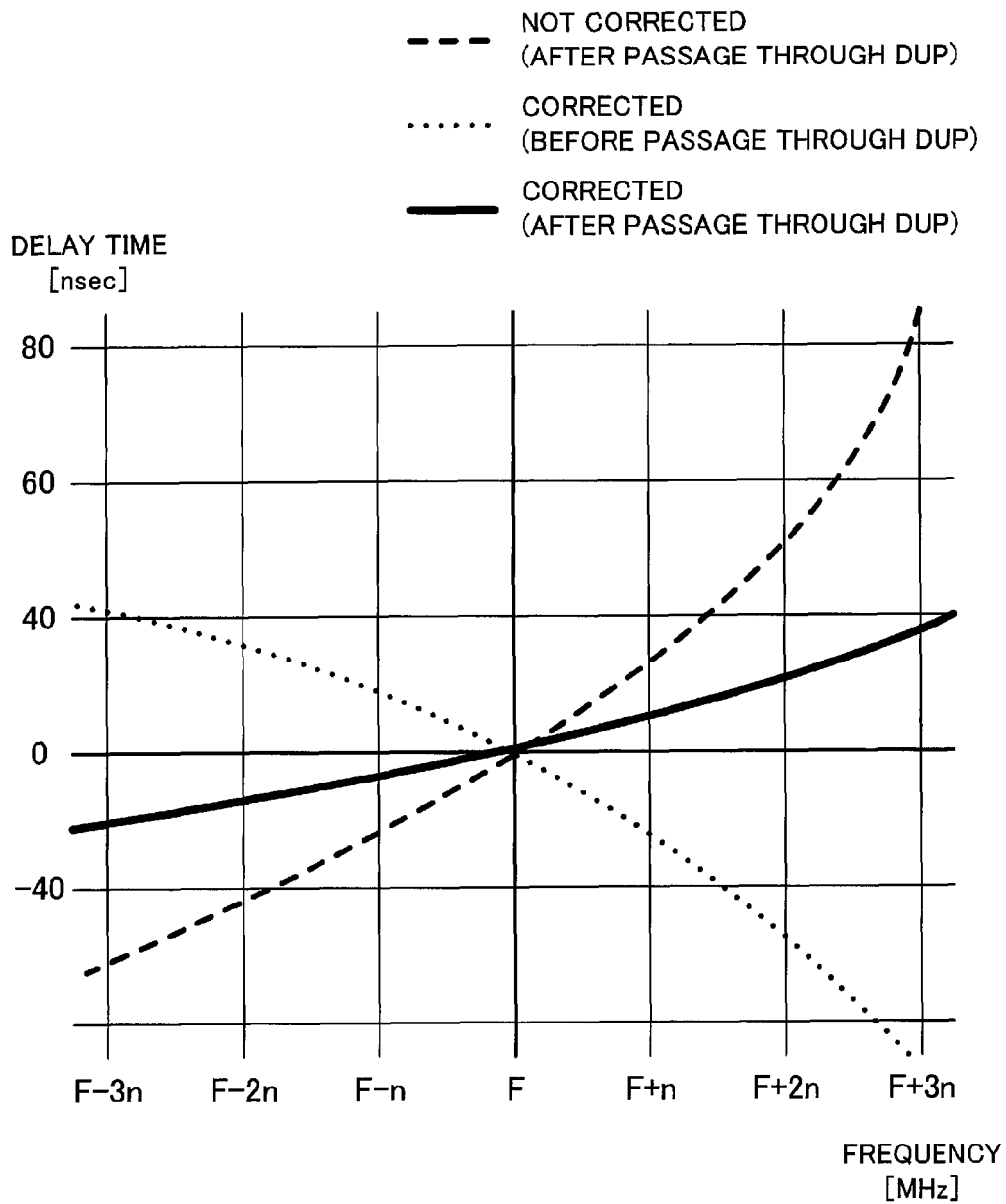
Figure 10:
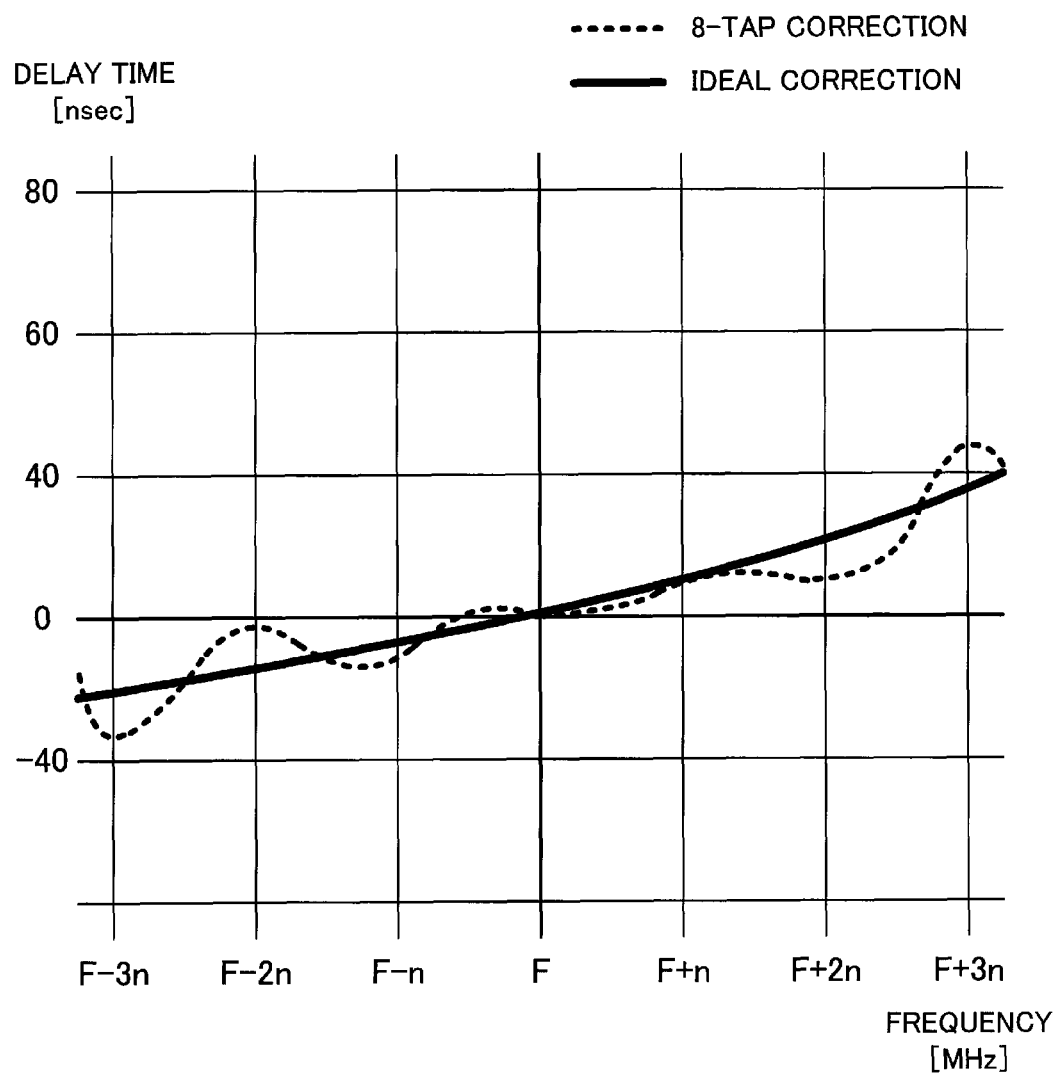
Figure 11:
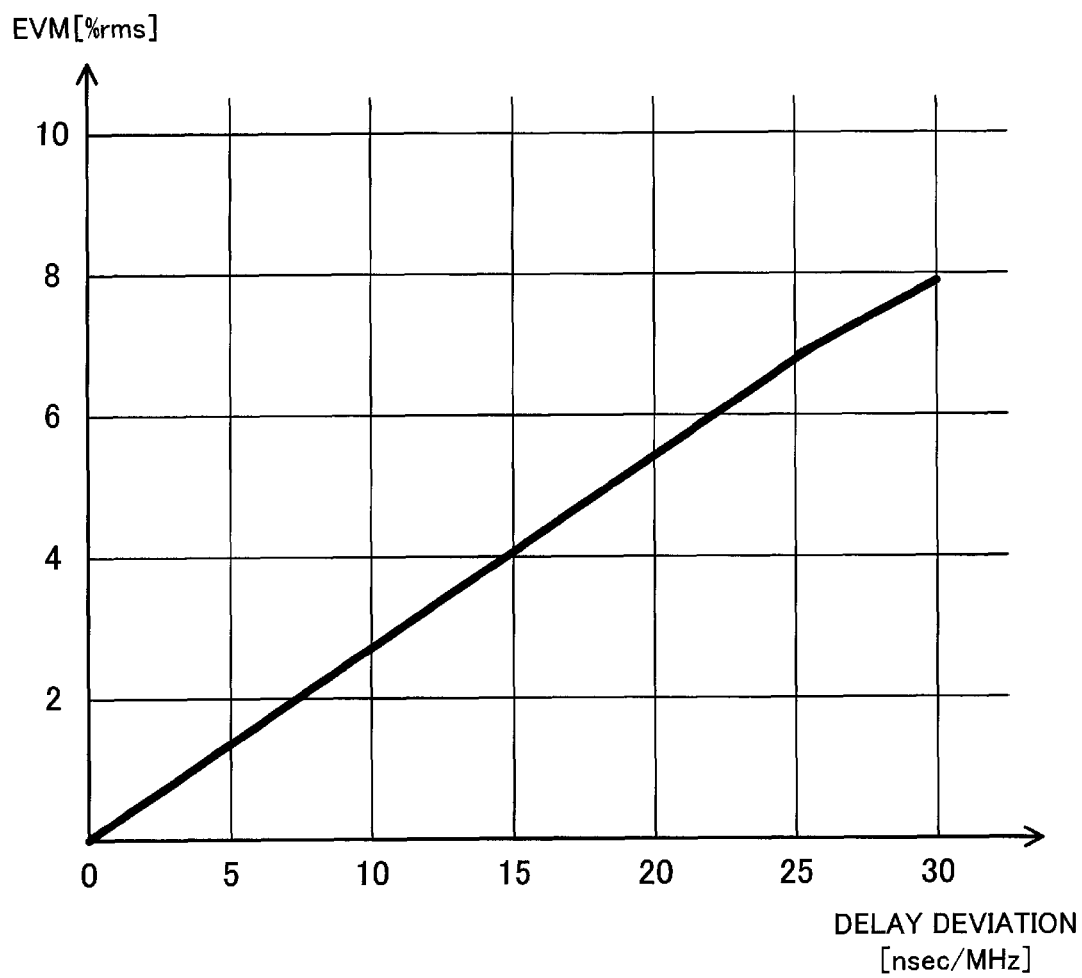
Figure 12:
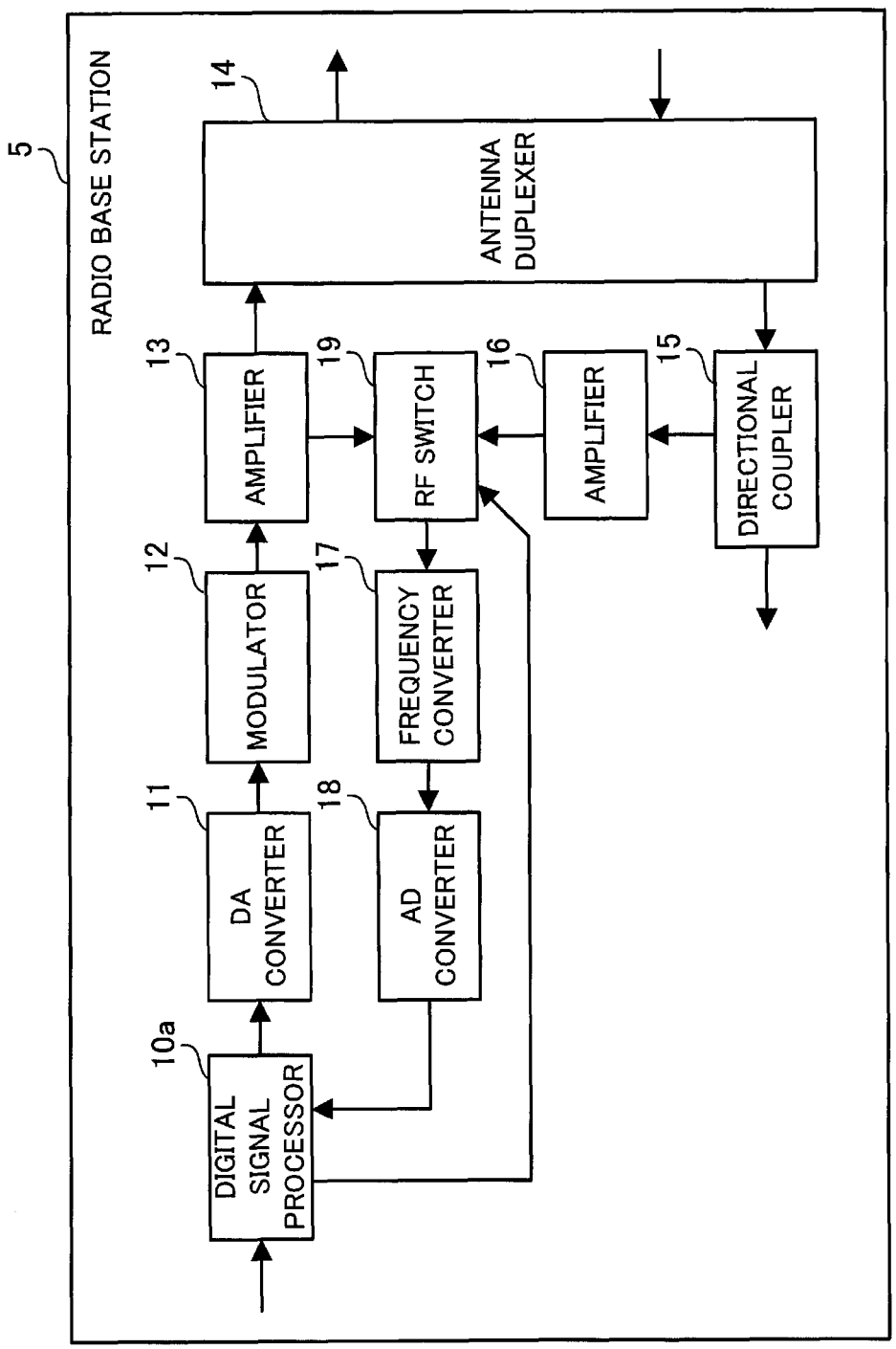
Figure 13:
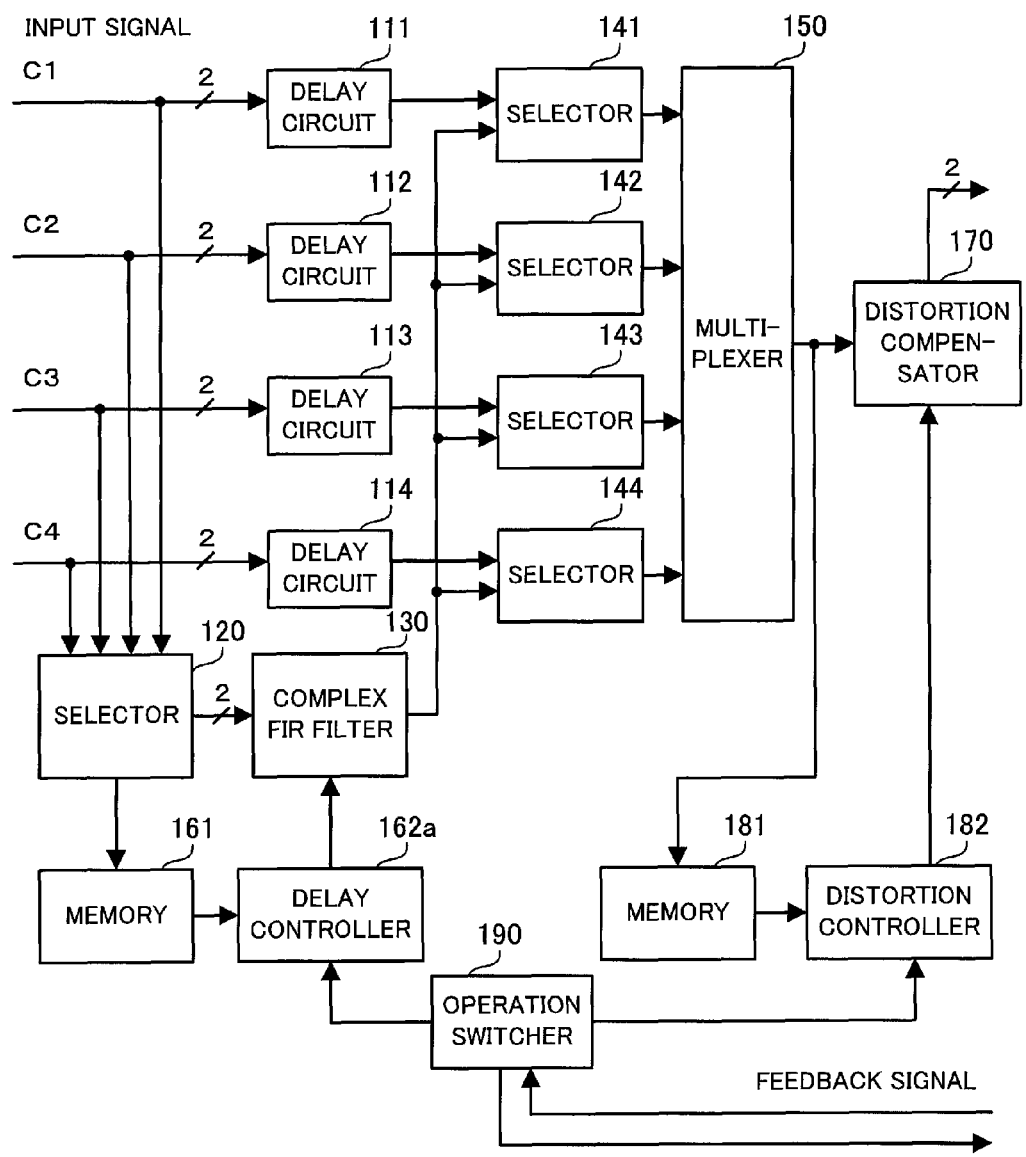
Figure 14:
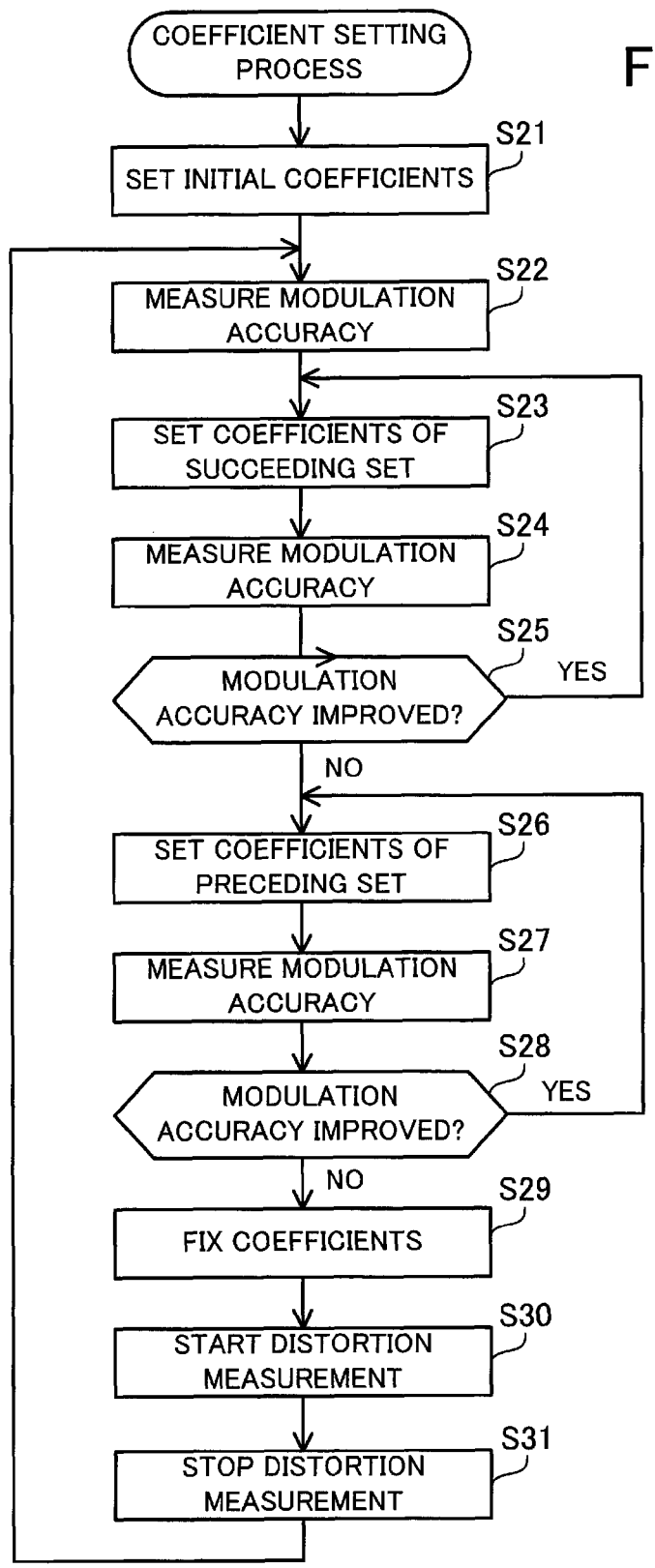

FIG. 1 is a schematic illustration of embodiments;
FIG. 2 is a block diagram illustrating functions of a radio base station according to a first embodiment;
FIG. 3 is a block diagram illustrating the function of a digital signal processor of the first embodiment;
FIG. 4 illustrates the data structure of a coefficient table;
FIG. 5 illustrates the circuit configuration of a complex FIR filter;
FIG. 6 illustrates the circuit configuration of a complex multiplier;
FIG. 7 is a flowchart illustrating the procedure of a coefficient setting process according to the first embodiment;
FIG. 8 illustrates processing results of the digital signal processor;
FIG. 9 is a first graph indicating a delay deviation caused by an antenna duplexer;
FIG. 10 is a second graph indicating a delay deviation caused by the antenna duplexer;
FIG. 11 is a graph indicating the relationship between delay deviation and modulation accuracy;
FIG. 12 is a block diagram illustrating functions of a radio base station according to a second embodiment;
FIG. 13 is a block diagram illustrating the function of a digital signal processor of the second embodiment; and FIG. 14 is a flowchart illustrating the procedure of a coefficient setting process according to the second embodiment.

DESCRIPTION OF EMBODIMENT(S)

Embodiments of the present invention will be described in detail below with reference to the accompanying drawings. First, the embodiments will be outlined, and then described in detail.

FIG. 1 is a schematic illustration of the embodiments. A communication device illustrated in FIG. 1 is configured to perform radio communication with other communication devices. The communication device comprises a transceiver amplifier 1, a band-pass filter 2, and a transmission antenna 3.

The transceiver amplifier 1 converts an input digital signal to an analog signal, then amplifies the analog signal, and outputs the amplified signal to the band-pass filter 2. The band-pass filter 2 removes frequency components outside a prespecified transmission frequency band from the analog signal received from the transceiver amplifier 1, and outputs the resultant signal to the transmission antenna 3. Using radio waves, the transmission antenna 3 outputs the analog signal received from the band-pass filter 2. The transceiver amplifier 1 includes a feedback section 1a and a digital signal processing section 1b.

The feedback section 1a acquires the analog signal that has passed through the band-pass filter 2, and converts the acquired analog signal to a digital signal. Then, the feedback section 1a feeds the obtained digital signal back to the digital signal processing section 1b as a feedback signal.

The digital signal processing section 1b temporarily holds the original digital signal that is not subjected to the digital-to-analog conversion. When the feedback signal is received from the feedback section 1a thereafter, the digital signal processing section 1b compares the feedback signal and the original digital signal with each other to measure modulation accuracy. The modulation accuracy represents an extent to which the position of the measured signal is deviated from that of an ideal signal. Usually, EVM (Error Vector Magnitude) is used as an index of the modulation accuracy. In this instance, the original digital signal that is not subjected to the digital-to-analog conversion corresponds to the ideal signal, and the feedback signal corresponds to the measured signal.

In accordance with the modulation accuracy measurement results, the digital signal processing section 1b subjects the subsequently input digital signal to delay correction. For example, the digital signal processing section 1b performs the delay correction by adjusting a correction amount so as to improve the modulation accuracy. Preferably, the measurement of the modulation accuracy and the adjustment of the correction amount by the digital signal processing section 1b are repeatedly executed on a regular or irregular basis.

The transmission antenna 3 may be a two-way transceiver antenna, instead of a transmission-only antenna. In this case, the two-way transceiver antenna is connected to an antenna duplexer (DUP: DUPlexer) for isolating transmit and receive signals from each other, and an internal filter of the antenna duplexer corresponds to the band-pass filter 2. Also, in this case, the feedback section 1a may generate the feedback signal by extracting an analog signal that leaks from the transmitting side to the receiving side within the antenna duplexer.

In the communication device thus configured, the analog signal that has passed through the band-pass filter 2 is converted to a digital signal by the feedback section 1a of the transceiver amplifier 1. Then, the modulation accuracy is measured by the digital signal processing section 1b of the transceiver amplifier 1 on the basis of the digital signal obtained from the feedback section 1a and the input digital signal, and delay correction is performed on the subsequently input digital signal so as to improve the modulation accuracy.

Accordingly, an optimum correction amount can be set for delay deviation compensation, making it possible to efficiently prevent reduction in the modulation accuracy attributable to the band-pass filter 2. As a result, the occurrence of decoding error at a receiving-side device can be satisfactorily suppressed, whereby the transmission efficiency can be further improved. It is also possible to automatically optimize the correction amount so as to follow up change in the characteristics of the band-pass filter 2 due to temperature variations or the replacement of component parts.

First Embodiment

A first embodiment will be now described in detail with reference to the drawings. A radio base station according to the first embodiment is equipped with a transceiver amplifier having delay deviation compensation function. Description of the function of a mobile station with which the radio base station communicates is omitted.

FIG. 2 is a block diagram illustrating functions of the radio base station of the first embodiment. The radio base station 4 comprises a digital signal processor 10, a DA converter 11, a modulator 12, an amplifier 13, an antenna duplexer 14, a directional coupler 15, an amplifier 16, a frequency converter 17, and an AD converter 18. The amplifier 16, the frequency converter and the AD converter 18 correspond to the aforementioned feedback section.

When a digital signal to be transmitted to a mobile station is input, the digital signal processor 10 performs a correction process for the delay deviation compensation, and outputs the corrected signal to the DA converter 11. The digital signal processor 10 periodically measures the EVM as an index of modulation accuracy and determines a correction amount based on the measured EVM. For example, the digital signal processor 10 receives a feedback signal from the AD converter 18 and compares the original input digital signal and the feedback signal with each other to measure the EVM. The process of correcting the digital signal will be described in detail later.

On receiving the corrected digital signal from the digital signal processor 10, the DA converter 11 converts the received digital signal to an analog signal and outputs the converted signal to the modulator 12. The DA converter 11 carries out digital-to-analog conversion with respect to each of I and Q components.

The modulator 12 includes a voltage-controlled oscillator for controlling transmission frequency. On receiving the I- and Q-component analog signal from the DA converter 11, the modulator 12 modulates the received signal according to a preset modulation scheme, and outputs the modulated signal to the amplifier 13.

When the modulated analog signal is received from the modulator 12, the amplifier 13 amplifies the received signal with a preset amplification factor and outputs the amplified signal to the antenna duplexer 14. The analog signal output from the amplifier 13 to the antenna duplexer 14 has a power level of about +40 dBm, for example.

The antenna duplexer 14 includes a band-pass filter for isolating transmit and receive signals from each other. On receiving the amplified transmit signal from the amplifier 13, the antenna duplexer 14 removes frequency components outside the transmission frequency band, and outputs the resultant signal to a transceiver antenna, not shown. Also, when a receive signal is received from the transceiver antenna, the antenna duplexer 14 removes frequency components outside the reception frequency band, and outputs the resultant signal to the directional coupler 15.

Thus, the antenna duplexer 14 is expected to perfectly isolate the transmit and receive signals from each other so that the transmit signal may not leak out to the receiving-side circuit. In practice, however, part of the transmit signal leaks out to the receiving-side circuit by reason of physical properties, with the result that the receive signal mixed with the transmit signal is output to the directional coupler 15. Transmission-reception isolation, that is, the ratio of the power level of the transmit signal to that of the transmit signal leaking to the receiving-side circuit is, for example, about 100 dB. The analog signal output from the antenna duplexer 14 to the directional coupler 15 has a power level of about −60 dBm, for example.

On receiving the analog signal from the antenna duplexer 14, the directional coupler 15 splits the received analog signal into two in a predetermined power ratio. One signal is output to the amplifier 16, while the other is output to a receiving-side processing section, not shown. In the receiving-side processing section, processes such as frequency conversion and low-noise amplification are executed.

When the split analog signal is received from the directional coupler 15, the amplifier 16 amplifies the received signal within the transmission frequency band, and outputs the amplified signal to the frequency converter 17. The amplifier 16 has auto gain control (AGC) function. Namely, the amplifier 16 is capable of varying the amplification factor in accordance with the power level of the transmit signal and the transmission-reception isolation of the antenna duplexer 14. The analog signal output from the amplifier 16 to the frequency converter 17 has a power level of about −10 dBm, for example.

On receiving the amplified analog signal from the amplifier 16, the frequency converter 17 converts the frequency of the received signal to a given frequency predetermined for internal use, and outputs the resultant signal to the AD converter 18.

When the analog signal is received from the frequency converter 17, the AD converter 18 converts the received signal to a digital signal, and outputs the converted digital signal as the feedback signal to the digital signal processor 10.

In the above example, the amplifier 16 has the auto gain control function. Alternatively, the amplifier may amplify the signal with a predetermined amplification factor, and the digital signal processor 10 may be configured to execute digital gain control (DGC).

The delay deviation compensation which the digital signal processor 10 performs to compensate a delay deviation caused in the antenna duplexer 14 will be now described in detail. In the following, it is assumed that the radio base station 4 transmits a 4-carrier radio signal through frequency-division multiplexing.

FIG. 3 is a block diagram illustrating the function of the digital signal processor of the first embodiment. The digital signal processor 10 includes delay circuits 111 to 114, a selector 120, a complex FIR filter 130, selectors 141 to 144, a multiplexer 150, a memory 161, and a delay controller 162.

The delay circuits 111 to 114 temporarily hold the I and Q components of their respective digital carrier signals. For example, the delay circuit 111 holds a carrier-C1 digital signal, and the delay circuit 112 holds a carrier-C2 digital signal. The delay circuit 113 holds a carrier-C3 digital signal, and the delay circuit 114 holds a carrier-C4 digital signal. After a lapse of a predetermined delay time, the delay circuits 111 to 114 output the digital signals held thereby to the selectors 141 to 144, respectively.

The selector 120 selects one of the carriers C1 to C4 whose delay deviation is to be compensated, and outputs the I- and Q-component digital signal of the selected carrier to the complex FIR filter 130. Also, the selector 120 outputs, to the memory 161, the same digital signal as the one output to the complex FIR filter 130. The carrier whose delay deviation is to be compensated is instructed beforehand from a controller, not shown.

The complex FIR filter 130 is an FIR (Finite Impulse Response) filter for performing complex calculations. On receiving the digital signal from the selector 120, the complex FIR filter 130 performs a correction process and outputs the result to the selectors 141 to 144. The complex FIR filter 130 has multiple sets of coefficients to be used for the correction process, and selects one set of coefficients in accordance with an instruction from the delay controller 162.

The selectors 141 to 144 select either the uncorrected digital signals received from the respective delay circuits 111 to 114 or the corrected digital signal received from the complex FIR filter 130. For example, where the carrier C1 is a carrier whose delay deviation is to be compensated, the selector 141 selects the digital signal received from the complex FIR filter 130, and where the carrier C1 is not a carrier whose delay deviation is to be compensated, the selector 141 selects the digital signal received from the delay circuit 111. The selectors 142 to 144 operate in the same manner. Then, the selectors 141 to 144 output the selected digital signals to the multiplexer 150. The carrier whose delay deviation is to be compensated is instructed in advance from the controller, not shown.

When the uncorrected or corrected digital signals are received from the selectors 141 to 144, the multiplexer 150 subjects the received signals to time-division multiplexing in predetermined order and outputs the multiplexed signal to the DA converter 11. In the digital signal output at this stage, the I and Q components are separated from each other.

The memory 161 temporarily holds the original digital signal that is not corrected. This digital signal is written in the memory 161 by the selector 120 and is read out from the memory 161 by the delay controller 162.

On receiving the feedback signal from the AD converter 18, the delay controller 162 reads out the original digital signal corresponding to the received feedback signal from the memory 161. Then, the delay controller 162 measures the EVM on the basis of the two digital signals, and compares the measured EVM with a previously measured EVM. In accordance with the comparison result, the delay controller 162 instructs the complex FIR filter 130 to change the correction amount, that is, the former instructs the latter to change the set of coefficients to be used for the correction process.

FIG. 4 illustrates the data structure of a coefficient table (coefficient storage). The coefficient table 139 illustrated in FIG. 4 is held by the complex FIR filter 130. The coefficient table 139 has rows indicating kinds of coefficients and columns indicating coefficient sets, and each coefficient set includes 16 coefficients $I_0$ to $I_7$ and $Q_0$ to $Q_7$. Also, each coefficient set is assigned a unique number in such a manner that a coefficient set with a greater number holds larger correction amounts.

For example, in the coefficient set #1 which is set as an initial state, $I_3$=32768 while all the other coefficients are "0". In a coefficient set #n, $I_0$=25, $I_1$=−3, $I_2$=−227, $I_3$=32648, $I_4$=420, $I_5$=−115, $I_6$=54, $I_7$=−35, $Q_0$=−239, $Q_1$=409, $Q_2$=−1268, $Q_3$=1990, $Q_4$=−1233, $Q_5$=381, $Q_6$=−230, and $Q_7$=201.

The complex FIR filter 130 selects one of the coefficient sets stored in the coefficient table 139 for the sake of delay deviation compensation.

FIG. 5 illustrates the circuit configuration of the complex FIR filter. The complex FIR filter 130 is an 8-tap FIR filter and includes, in addition to the coefficient table 139 illustrated in FIG. 4, flip-flops 131a to 131g and 132a to 132g (hereinafter abbreviated as FFs 131a to 131g and 132a to 132g), complex multipliers 133a to 133h, an adder 134, rounders 135 and 136, and clippers 137 and 138.

The FFs 131a to 131g and 132a to 132g are each a circuit for holding data for only one cycle. When data is input, each of the FFs 131a to 131f and 132a to 132f holds the data and outputs same to the succeeding-stage FF in the next cycle. The data transferred between the FFs 131a to 131g and 132a to 132g has a length of, for example, 15 bits.

For example, when the I-component digital signal is input from the selector 120, the FF 131a extracts a predetermined bit length as data from the input signal and holds the extracted data. Then, in the next cycle, the FF 131a outputs the data to the FF 131b. In like manner, the data is successively output to the FFs 131c to 131g. Also, when the Q-component digital signal is input from the selector 120, the FF 132a extracts the predetermined bit length as data from the input signal and holds the extracted data. In the next cycle, the FF 132a outputs the data to the FF 132b. Likewise, the data is successively output to the FFs 132c to 132g.

The complex multipliers 133a to 133h acquire respective I- and Q-component data transferred between the FFs 131a to 131g and 132a to 132g. For example, the complex multiplier 133a acquires the data input to the FFs 131a and 132a. The complex multiplier 133b acquires the data output from the FFs 131a and 132a, and the complex multiplier 133c acquires the data output from the FFs 131b and 132b. The complex multiplier 133d acquires the data output from the FFs 131c and 132c, and the complex multiplier 133e acquires the data output from the FFs 131d and 132d. The complex multiplier 133f acquires the data output from the FFs 131e and 132e, and the complex multiplier 133g acquires the data output from the FFs 131f and 132f. The data stored in the FFs 131g and 132g is acquired in the next cycle by the complex multiplier 133h.

Also, the complex multipliers 133a to 133h read in the respective coefficients included in the currently selected coefficient set. For example, the complex and the complex multiplier 133b reads in the coefficients $I_1$ and $Q_1$. The complex multiplier 133c reads in the coefficients $I_2$ and $Q_2$, the complex multiplier 133d reads in the coefficients $I_3$ and $Q_3$, the complex multiplier 133e reads in the coefficients $I_4$ and $Q_4$, the complex multiplier 133f reads in the coefficients $I_5$ and $Q_5$, the complex multiplier 133g reads in the coefficients $I_6$ and $Q_6$, and the complex multiplier 133h reads in the coefficients $I_7$ and $Q_7$. The coefficients $I_0$ to $I_7$ and $Q_0$ to $Q_7$ are each a 16-bit numerical value, for example.

In each cycle, the complex multipliers 133a to 133h individually perform a complex calculation by using the two pieces of input data and the two coefficients. The complex multipliers 133a to 133h then output, to the adder 134, the results of the calculations performed on the I and Q components. Details of the complex calculations will be described later.

On receiving the calculation results from the complex multipliers 133a to 133h, the adder 134 calculates sums of the I and Q components, respectively. Then, the adder 134 outputs the sum of the I components to the rounder 135, and outputs the sum of the Q components to the rounder 136. The data output from the adder 134 to each of the rounders 135 and 136 is 33 bits in length, for example.

The rounders 135 and 136 each perform a rounding process on the data received from the adder 134, and output the processing results to the respective clippers 137 and 138. For example, the rounder 135 rounds the I-component data and outputs the result to the clipper 137. The rounder 136 rounds the Q-component data and outputs the result to the clipper 138. The data output from the rounders 135 and 136 to the respective clippers 137 and 138 has a length of, for example, 18 bits.

The clippers 137 and 138 individually perform a clipping process on the data received from the respective rounders 135 and 136, in order to restore the data to the bit length before the complex calculation. For example, if the received data is greater than a maximum value that the bit length before the complex calculation can represent, the clippers 137 and 138 replace the received data with the maximum value, and if the received data is smaller than a minimum value that the bit length before the complex calculation can represent, the clippers 137 and 138 replace the received data with the minimum value.

Subsequently, the clippers 137 and 138 output the processing results to the selectors 141 to 144. Thus, the length of the digital signal input from the selector 120 to the complex FIR filter 130 and the length of the digital signal output from the complex FIR filter 130 to the selectors 141 to 144 can be made equal to each other.

FIG. 6 illustrates the circuit configuration of the complex multiplier. The complex multiplier 133a is a circuit configured to perform a complex calculation on the input data $I_{in}$ and $Q_{in}$ and the coefficients $I_0$ and $Q_0$ to obtain output data $I_{out}$ and $Q_{out}$. As illustrated in FIG. 6, the complex multiplier 133a comprises four arithmetic multipliers and two arithmetic adders. With the complex multiplier 133a, the calculation indicated by the following expression is performed:

$$(I_{in}+jQ_{in}) \times (I_0+jQ_0) = (I_{in} \times I_0 - Q_{in} \times Q_0) + j(I_{in} \times Q_0 + Q_{in} \times I_0) \quad (1)$$

Namely, the output data $I_{out}$ and $Q_{out}$ is calculated in the following manner:

$$I_{out} = I_{in} \times I_0 - Q_{in} \times Q_0$$

$$Q_{out} = I_{in} \times Q_0 + Q_{in} \times I_0 \quad (2)$$

Each of the complex multipliers 133b to 133h also has the same circuit configuration as the complex multiplier 133a.

The following describes in detail the process executed by the radio base station 4 having the configuration and data structures explained above.

FIG. 7 is a flowchart illustrating the procedure of a coefficient setting process according to the first embodiment. In the following, the process illustrated in FIG. 7 will be explained in order of step number.

Step S11: When the operation of the digital signal processor 10 is started, the complex FIR filter 130 reads out the coefficients of the coefficient set #1 from the coefficient table 139. Then, the complex FIR filter 130 sets the read coefficients as initial coefficients in the respective complex multipliers.

Step S12: When the feedback signal is received from the AD converter 18, the delay controller 162 reads out the original input signal corresponding to the received feedback signal from the memory 161. Then, the delay controller 162 compares the original input signal and the feedback signal with each other to measure the EVM.

Step S13: The delay controller 162 instructs the complex FIR filter 130 to apply a coefficient set of which the number is greater by "1" than that of the currently applied coefficient set. The complex FIR filter 130 reads out the coefficients of the instructed coefficient set from the coefficient table 139 and sets the read coefficients in the respective complex multipliers.

Step S14: When the feedback signal to which the newly set coefficient set has been applied is received from the AD converter 18, the delay controller 162 reads out the original input signal corresponding to the received feedback signal from the memory 161 and measures the EVM.

Step S15: The delay controller 162 compares the EVM measured in Step S14 with the previously measured EVM. Then, the delay controller 162 determines whether or not the EVM has improved as a result of the change of the coefficient set in Step S13. If the EVM is improved, the process proceeds to Step S13. If the EVM is not improved, that is, if the EVM remains the same or has deteriorated, the process proceeds to Step S16.

Step S16: The delay controller 162 instructs the complex FIR filter 130 to apply a coefficient set whose number is smaller by "1" than that of the currently applied coefficient set. The complex FIR filter 130 reads out the coefficients of the instructed coefficient set from the coefficient table 139 and sets the read coefficients in the respective complex multipliers.

Step S17: When the feedback signal to which the newly set coefficient set has been applied is received from the AD converter 18, the delay controller 162 reads out the original input signal corresponding to the received feedback signal from the memory 161 and measures the EVM.

Step S18: The delay controller 162 compares the EVM measured in Step S17 with the previously measured EVM. Subsequently, the delay controller 162 determines whether or not the EVM has improved as a result of the change of the coefficient set in Step S16. If the EVM is improved, the process proceeds to Step S16. On the other hand, if the EVM is not improved, the process proceeds to Step S19.

Step S19: The delay controller 162 instructs the complex FIR filter 130 to apply the previously applied coefficient set, that is, the coefficient set that was applied before the change in Step S16. The complex FIR filter 130 reads out the coefficients of the instructed coefficient set from the coefficient table 139 and sets the read coefficients in the respective complex multipliers.

Step S20: The delay controller 162 terminates the EVM measurement and the coefficient set adjustment and then waits for a fixed time. The process thereafter proceeds to Step S12.

In this manner, the delay controller 162 measures the EVM with the correction amount increased or decreased stepwise, and determines the correction amount with which an optimum EVM is obtained. The delay controller 162 executes such adjustment of the correction amount on an ongoing basis, so as to cope with change in the communication environment.

The delay controller 162 may use an EVM calculated by a simplified method, instead of the exact EVM. Provided the I and Q components of the original input signal are $I_{ref}$ and $Q_{ref}$, respectively, and the I and Q components of the feedback signal are $I_{fb}$ and $Q_{fb}$, respectively, the delay controller 162 may calculate the EVM by a simplified method indicated below, for example:

$$EVM = \mathrm{sum}((I_{ref}-I_{fb})^2+(Q_{ref}-Q_{fb})^2) \div \mathrm{sum}(I_{ref}^2+Q_{ref}^2) \quad (3)$$

FIG. 8 illustrates processing results obtained by the digital signal processor. The I- and Q-component data illustrated on the left part of FIG. 8 indicates data prior to the correction by the complex FIR filter 130, and the I- and Q-component data illustrated on the right part indicates data corrected by the complex FIR filter 130.

For example, data of which the I and Q components were −3350 and −3456, respectively, before the correction is corrected to: I component=4182 and Q component=−6721. Also, data whose I and Q components were 4224 and −3314, respectively, before the correction is corrected to: I component=−2263 and Q component=−5552. Compared with the uncorrected data, the corrected data has been given such delay deviation as to cancel out the delay deviation caused in the antenna duplexer 14.

FIG. 9 is a first graph illustrating the delay deviation attributable to the antenna duplexer. The graph of FIG. 9 indicates the relationship between the delay time and frequency of signal relative to a certain reference frequency F. For example, FIG. 9 depicts the following three relationships: (1) the relationship between the original input signal and the signal passed through the antenna duplexer 14 when no delay compensation is performed; (2) the relationship between the original input signal and the corrected signal when the delay compensation is performed; and (3) the relationship between the original input signal and the signal passed through the antenna duplexer 14 when the delay compensation is performed.

As illustrated in FIG. 9, if no delay compensation is performed, the signal passed through the antenna duplexer 14 contains a large delay deviation. For example, the delay time of high-frequency components is significantly longer than that of low-frequency components. If such a large delay deviation exists between the high- and low-frequency components of one carrier signal, then it is difficult for the mobile station to decode the signal, with the result that decoding error occurs with high frequency.

On the other hand, with the delay deviation compensation, the digital signal is given such a delay as to cancel out the delay deviation caused in the antenna duplexer 14. For example, as illustrated in FIG. 9, a large delay is given to the low-frequency components and a small delay is given to the high-frequency components. Where the signal corrected in this manner is input to the antenna duplexer 14, the delay deviation after the passage through the antenna duplexer 14 is suppressed, as illustrated in FIG. 9.

FIG. 10 is a second graph illustrating a delay deviation caused by the antenna duplexer. In FIG. 9, an ideally corrected curve is illustrated, but in practice, a pulsating waveform as illustrated in FIG. 10 is obtained in the case where an FIR filter with a finite number of taps is used for the correction. The ripple factor can be reduced by increasing the number of taps of the FIR filter. Increasing the number of taps, however, leads to an increase in the delay time caused by the FIR filter. Even in the case where the relationship between the delay time and the frequency is in pulsating form as illustrated in FIG. 10, the EVM improvement effect is obtained.

FIG. 11 is a graph illustrating the relationship between the delay deviation and the modulation accuracy. For example, the graph of FIG. 11 illustrates the delay deviation-EVM relationship obtained as a result of the simulated radio communication carried out by the applicant hereof. The simulation was conducted under the conditions of downlink test model 3. The downlink test model 3 is a test model assuming a radio base station that uses 32 DPCHs (Dedicated Physical CHannels).

In the graph, the delay deviation is expressed in the unit nanosecond/MHz and is obtained by dividing the difference between the delay time of the highest frequency within one carrier and that of the lowest frequency within the same carrier by the frequency bandwidth. Also, the EVM is expressed in the unit percentage root mean square and is obtained by the calculation method explained above. As illustrated in FIG. 11, the obtained results are as follows: the EVM was 4.04% rms at the delay deviation 15 nsec/MHz, the EVM was 5.36% rms at the delay deviation 20 nsec/MHz, the EVM was 6.31% rms at the delay deviation 25 nsec/MHz, and the EVM was 7.94% rms at the delay deviation 30 nsec/MHz.

Further, the applicant measured the EVM under the conditions of downlink test model 5 with and without the delay deviation compensation. The downlink test model 5 is a test model assuming a radio base station using 30 DPCHs and 8 HS-PDSCHs (High-Speed Physical Downlink Shared CHannels).

As a result of the measurements, it was found that where the delay deviation was not compensated, the EVMs before and after the passage through the antenna duplexer were 2.79% rms and 7.42% rms, respectively. On the other hand, where the delay deviation was compensated, the corrected EVMs before and after the passage through the antenna duplexer were 6.47% rms and 3.38% rms, respectively. Thus, when the delay deviation is not compensated, the EVM significantly deteriorates because of the passage through the antenna duplexer. On the other hand, when the delay deviation is compensated, the EVM once deteriorates due to the correction but deterioration in the EVM of the signal passed through the antenna duplexer is suppressed.

By using the radio base station configured as described above, the input digital signal can be corrected so as to suppress the delay deviation of the analog signal that has passed through the antenna duplexer. In this case, the correction amount is dynamically adjusted so as to optimize the EVM. Accordingly, the occurrence of decoding error at the mobile station can be satisfactorily suppressed, making it possible to further improve the transmission efficiency.

It is also possible to automatically cope with change in the characteristics of the antenna duplexer due to temperature variations or the replacement of components parts. Accordingly, even in the case where the manufacturer of the transceiver amplifier differs from that of the antenna duplexer, optimum communication environment can be quickly created without the need for adjustment work at the time of installing the radio base station.

Second Embodiment

A second embodiment will be now described in detail with reference to the drawings. The following description is focused on the differences between the first and second embodiments, and description of identical elements or operations is omitted. A radio base station according to the second embodiment is equipped with a transceiver amplifier having both delay deviation compensation function and amplification distortion compensation function and configured so that a single feedback circuit can be used for both the delay deviation compensation and the amplification distortion compensation.

FIG. 12 is a block diagram illustrating functions of the radio base station of the second embodiment. The radio base station 5 comprises a digital signal processor 10a, a DA converter 11, a modulator 12, an amplifier 13, an antenna duplexer 14, a directional coupler 15, an amplifier 16, a frequency converter 17, an AD converter 18, and an RF switch 19. The DA converter 11, the modulator 12, the amplifier 13, the antenna duplexer 14, the directional coupler 15, the amplifier 16, the frequency converter 17 and the AD converter 18 have functions identical with those of the corresponding elements of the first embodiment.

When a digital signal to be transmitted to a mobile station is input, the digital signal processor 10a performs a correction process for the delay deviation compensation as well as a correction process for the amplification distortion compensation, and outputs the resultant signal to the DA converter 11. The digital signal processor 10a periodically measures the EVM to determine the correction amount for the delay deviation compensation. Also, the digital signal processor 10a periodically measures an amplification distortion to determine a correction amount for the amplification distortion compensation. The EVM and the amplification distortion are measured at different timings. In this case, since the feedback signal necessary for the EVM measurement differs from that necessary for the amplification distortion measurement, the digital signal processor 10a sends a control signal for switchover of the feedback signal to the RF switch 19 when necessary.

The RF switch 19 selects one of the analog signals output from the amplifiers 13 and 16, and outputs the selected signal to the frequency converter 17. When the control signal is received from the digital signal processor 10a, the RF switch 19 switches to the analog signal to be selected. As a result, the feedback signal corresponding to a signal having passed through the amplifier 13 and the feedback signal corresponding to a signal having passed through the antenna duplexer 14 are output from the AD converter 18 to the digital signal processor 10a in a time divided manner.

FIG. 13 is a block diagram illustrating the function of the digital signal processor of the second embodiment. The digital signal processor 10a includes delay circuits 111 to 114, a selector 120, a complex FIR filter 130, selectors 141 to 144, a multiplexer 150, a memory 161, a delay controller 162a, a distortion compensator 170, a memory 181, a distortion controller 182, and an operation switcher 190. The delay circuits 111 to 114, the selector 120, the complex FIR filter 130, the selectors 141 to 144, the multiplexer 150 and the memory 161 have functions identical with those of the corresponding elements of the first embodiment.

When the feedback signal is received from the operation switcher 190, the delay controller 162a reads out the original digital signal corresponding to the received feedback signal from the memory 161. Then, the delay controller 162a compares the two digital signals with each other to measure the EVM and, in accordance with the measurement result, instructs the complex FIR filter 130 to change the correction amount.

On receiving the digital signal from the multiplexer 150, the distortion compensator 170 performs a correction process for compensating the amplification distortion caused by the amplifier 13, and outputs the result to the DA converter 11. The distortion compensator 170 determines its correction amount in accordance with instructions from the distortion controller 182.

The memory 181 temporarily stores the digital signal that has been multiplexed but is not subjected to the distortion compensation. The digital signal output from the multiplexer 150 is stored in the memory 181 one after another. Also, the digital signal is read from the memory 181 by the distortion controller 182 when necessary.

On receiving the feedback signal from the operation switcher 190, the distortion controller 182 reads out the original digital signal corresponding to the received feedback signal from the memory 181. Then, the distortion controller 182 compares the two digital signals with each other to measure the amplification distortion and, in accordance with the measurement result, instructs the distortion compensator 170 to change the correction amount.

When the feedback signal corresponding to the signal having passed through the antenna duplexer 14 is received from the AD converter 18, the operation switcher 190 forwards the received signal to the delay controller 162a. On the other hand, when the feedback signal corresponding to the signal having passed through the amplifier 13 is received from the AD converter 18, the operation switcher 190 forwards the received signal to the distortion controller 182. Also, the operation switcher 190 sends the control signal to the RF switch 19 when needed.

FIG. 14 is a flowchart illustrating the procedure of a coefficient setting process according to the second embodiment. Steps S21 to S29 are identical in content with the respective Steps S11 to S19 of the coefficient setting process of the first embodiment, and therefore, description of these steps is omitted. In the coefficient setting process of the second embodiment, Steps S30 and S31 explained below are executed following Steps S21 to S29.

Step S30: When the adjustment of the correction amount by the delay controller 162a is finished, the operation switcher 190 sends the control signal to the RF switch 19. Then, the operation switcher 190 starts to forward the feedback signal, received from the AD converter 18, to the distortion controller 182. On receiving the feedback signal from the operation switcher 190, the distortion controller 182 starts to adjust the correction amount.

Step S31: After a lapse of a fixed time from the start of execution of Step S30, the operation switcher 190 sends the control signal to the RF switch 19. Subsequently, the operation switcher 190 starts to forward the feedback signal, received from the AD converter 18, to the delay controller 162a. The process thereafter proceeds to Step S22.

In this manner, the operation switcher 190 performs a control action such that the adjustment of the correction amount by the distortion controller 182 is usually executed while the adjustment of the correction amount by the delay controller 162a, instead of the distortion controller 182, is executed at regular intervals of time. To this end, the operation switcher 190 sends the control signal to the RF switch 19 in order to switch the signal to be acquired as the feedback signal. The operation switcher 190 may be configured to forcibly switch the control from the delay controller 162a to the distortion controller 182 when the correction amount for the amplification distortion compensation needs to be adjusted even while the delay controller 162a is in operation.

By using the radio base station configured as described above, it is possible to obtain the same advantageous effects as those achieved by the first embodiment. Further, with the radio base station of the second embodiment, both the delay deviation compensation and the amplification distortion compensation can be accomplished by the transceiver amplifier. Since the feedback circuit can be shared by the delay deviation compensation and the amplification distortion compensation, increase in the size of the transceiver amplifier can be suppressed.

In the foregoing embodiments, the transceiver amplifier with the delay deviation compensation function is mounted on a radio base station but may be mounted on other types of communication devices. Also, in the above embodiments, an antenna duplexer is connected to the transceiver amplifier. Alternatively, band-pass filters prepared separately for transmission and reception purposes may be connected to the transceiver amplifier. Further, in the embodiments, the correction amount is dynamically adjusted in accordance with the feedback signal but may be set at a fixed amount.

According to the embodiments, the signal that has passed through the band-pass filter is compared with the input signal to measure the modulation accuracy, and the delay correction is executed in accordance with the measured modulation accuracy. This makes it possible to set an optimum correction amount, and thus the occurrence of decoding error at a receiving-side device is satisfactorily suppressed, enabling further improvement in transmission efficiency. It is also possible to automatically optimize the correction amount so as to follow up change in the characteristics of the band-pass filter attributable to temperature variations or the replacement of component parts.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has (have) been described in detail, it should be understood that various changes, substitutions and alterations could be made hereto without departing from the spirit and scope of the invention.

What is claimed is:

1. A transceiver amplifier for converting an input digital signal to an analog signal, amplifying the analog signal, and outputting the amplified analog signal to a band-pass filter, the transceiver amplifier comprising:
   a feedback section configured to acquire an analog signal that has passed through the band-pass filter, and convert the acquired analog signal to a digital signal, the analog signal including a frequency component of a first frequency and a frequency component of a second frequency, the band-pass filter having different delay time for processing between the first frequency and the second frequency; and
   a digital signal processing section configured to compare the digital signal obtained from the feedback section and the input digital signal with each other to measure modulation accuracy, and perform delay correction on a subsequently input digital signal to compensate a difference of delay time of the band-pass filter between a frequency component of the first frequency and a frequency component of the second frequency in accordance with the measured modulation accuracy.

2. The transceiver amplifier according to claim 1, wherein:
   the feedback section converts the amplified analog signal to a digital signal in a time divided manner with respect to the analog signal that has passed through the band-pass filter, and
   the digital signal processing section compares the digital signal corresponding to the amplified analog signal and the input digital signal with each other and, in accordance with a comparison result, performs amplification distortion compensation.

3. The transceiver amplifier according to claim 1, wherein the band-pass filter is a filter constituting an antenna duplexer.

4. The transceiver amplifier according to claim 3, wherein the feedback section extracts an analog signal that has leaked to a receiving-side circuit in the antenna duplexer after passing through the band-pass filter.

5. The transceiver amplifier according to claim 1, wherein the digital signal processing section includes a coefficient storage in which delay correction levels are correlated with coefficients used for the delay correction, and selects a coefficient for the delay correction, from among those stored in the coefficient storage in accordance with the modulation accuracy.

6. A delay deviation compensation method for a transceiver amplifier configured to convert an input digital signal to an analog signal, amplify the analog signal, and output the amplified analog signal to a band-pass filter, the delay deviation compensation method comprising:

acquiring an analog signal that has passed through the band-pass filter, and converting the acquired analog signal to a digital signal, the analog signal including a frequency component of a first frequency and a frequency component of a second frequency, the band-pass filter having different delay time for processing between the first frequency and the second frequency; and comparing the digital signal converted from the analog signal and the input digital signal with each other to measure modulation accuracy, and performing delay correction on a subsequently input digital signal to compensate a difference of delay time of the band-pass filter between a frequency component of the first frequency and a frequency component of the second frequency in accordance with the measured modulation accuracy.

* * * * *